United States Patent
Freitas

(10) Patent No.: US 6,670,822 B2
(45) Date of Patent: Dec. 30, 2003

(54) TRANSCEIVER DRIVER WITH PROGRAMMABLE EDGE RATE CONTROL INDEPENDENT OF FABRICATION PROCESS, SUPPLY VOLTAGE, AND TEMPERATURE

(75) Inventor: Oscar W. Freitas, Cape Elizabeth, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 661 days.

(21) Appl. No.: 09/132,595

(22) Filed: Aug. 11, 1998

(65) Prior Publication Data

US 2003/0094970 A1 May 22, 2003

(51) Int. Cl.$^7$ .............................................. H03K 19/003
(52) U.S. Cl. ............................ 326/34; 326/83; 326/86
(58) Field of Search ............................... 326/31, 34, 83, 326/86

(56) References Cited

U.S. PATENT DOCUMENTS

| | | | |
|---|---|---|---|
| 4,752,703 A | * 6/1988 | Lin | 327/391 |
| 4,937,476 A | * 6/1990 | Bazes | 326/32 |
| 5,120,992 A | 6/1992 | Miller et al. | |
| 5,198,699 A | * 3/1993 | Hashimoto et al. | 326/121 |
| 5,218,239 A | 6/1993 | Boomer | |
| 5,289,051 A | 2/1994 | Zitta | |
| 5,337,070 A | 8/1994 | Kitajima et al. | |
| 5,438,282 A | 8/1995 | Kuo | 326/86 |
| 5,463,331 A | 10/1995 | Kuo | 326/86 |
| 5,486,774 A | * 1/1996 | Douseki et al. | 326/33 |
| 5,539,341 A | 7/1996 | Kuo | 327/108 |
| 5,548,233 A | 8/1996 | Susak | |
| 5,557,223 A | 9/1996 | Kuo | 327/108 |
| 5,563,542 A | 10/1996 | Watarai | 327/382 |
| 5,680,062 A | 10/1997 | Lee et al. | 326/63 |
| 5,729,165 A | 3/1998 | Lou et al. | 327/112 |
| 5,731,711 A | 3/1998 | Gabara | 326/30 |
| 5,757,249 A | 5/1998 | Gabara et al. | 333/101 |

FOREIGN PATENT DOCUMENTS

| | | |
|---|---|---|
| EP | 0678983 A1 | 10/1995 |
| JP | 62194731 | 8/1987 |

* cited by examiner

*Primary Examiner*—Don Phu Le
(74) *Attorney, Agent, or Firm*—Cesari and McKenna, LLP; Edwin H. Paul, Esq.

(57) ABSTRACT

A transceiver driver for shaping an output signal includes one or more capacitive elements designed to manipulate the current applied to the control node of the driver's output transistor. The capacitive elements may be one or more capacitors coupled to an inverter branch that provides turn-on and turn-off potential to the gate of the output transistor. The capacitive elements act to charge or discharge the transistor's gate gradual in a highly programmable way so as to make the driver substantially independent of fabrication, supply voltage, and operating temperature vagaries.

17 Claims, 4 Drawing Sheets

TRANSCEIVER DRIVER WITH PROGRAMMABLE EDGE RATE CONTROL INDEPENDENT OF FABRICATION PROCESS, SUPPLY VOLTAGE, AND TEMPERATURE

BACKGROUND OF THE INVENTION

1. Field of the Invention

The present invention relates to circuitry for transmitting electrical signals from one location to another. In particular, the present invention relates to output drivers designed to provide timely transmission of such signals at required potentials and with sufficient current for communications between coupled devices. Still more particularly, the present invention relates to circuitry for regulating the transition of logic signals between "high" and "low" levels, including those associated with Complementary Metal-Oxide-Silicon (CMOS) transistor-based output drivers.

2. Description of the Prior Art

Output drivers are used to transfer electrical signals of desired amplitude and strength. Signal transfers occur by way of buses—interfaces that couple active devices that are either on the same semiconductor-based chip or on different chips. The devices may be located proximate to one another, or they may be some distance from one another. One example of a proximate device interface requiring one or more bus connections is the coupling of one printed circuit board to another within a computing system, such as through a backplane bus. An example of a remote device interface requiring one or more bus connections is the coupling of one computing system to another, such as through a telephone transmission line that is, effectively, a voice/data bus.

A continuing goal in all computing and communication systems is to be able to transfer electrical signals accurately and as quickly as possible. In order to achieve that goal, it is important that those signals are transmitted at relatively uniform rates, amplitudes, and strengths. This is more likely to occur within a single computing system, less so when interfacing of a plurality of non-uniform computing systems is involved. Protocols have been developed to provide for transmission rate, amplitude, and strength uniformity so as to develop compatibility between systems and between sub-systems.

Since different active devices operate at different rates, e.g., printers versus memory devices, and have different load drains as a function of internal operations, each device requires one or more output drivers to meet transmission uniformity requirements. Output drivers are needed to increase signal gain prior to output to a bus, they are required to slow or increase the transmission rate of a signal to be delivered, or a combination of the two. It is to be understood that these "output" drivers may also operate to receive transmissions from the bus for delivery back to the active device for interpretation and action, if any. Given this dual operation capability, these unifying drivers are generally identified as transceivers.

It is well known that in digital systems the signals moving between devices are categorized as either logic level high (or "1" or "ON") and logic level low (or "0" or "OFF"). The particular signal potential that defines whether a logic high or a logic low is being transmitted is dependent upon the semiconductor components that form the circuitry associated with that transmission. The most common circuit configurations used to produce digital signals include, among others, CMOS, Transistor-Transistor:Logic (TTL), and Emitter-Coupled Logic (ECL)—positive ECL (PECL) in particular. Each of these logic configurations operates differently as a function of the "swing" between what constitutes a logic high signal and what constitutes a logic low signal.

For CMOS logic, which is based primarily on the use of MOS transistors, a logic low signal is generally developed in the range of 0.6 volts (V) above a low-potential power rail GND, which may be at 0.0V. A logic high signal is generally developed in the range of Vcc to Vcc-0.6V, where Vcc may vary between 4.5V and 5.5V for a nominal 5-volt supply, or between 3.0V and 3.6V for a nominal 3.3-volt supply. For a 5-volt supply then, the differential swing between low and high must be at least 3.9 volts in order to ensure that a desired shift between a logic low and a logic high will occur. TTL and ECL logic configurations, on the other hand, are based primarily on the use of bipolar transistors. The differential swing for a shift between a logic low and a logic high is significantly less than it is for CMOS operation-it may as low as 1.0 volt. For PECL systems, for example, the swings are even closer. In PECL circuitry, which is Vcc dependent, a logic high is equivalent to a potential of about Vcc-0.9V, and a logic low is equivalent to a potential of about Vcc-1.7V. Thus, in mating CMOS and non-CMOS transmissions, it can be seen that variations in potential swings will not automatically ensure the triggering of a desired swing from one logic level to another. Furthermore, minor potential swings in CMOS signals may not effect any logic level change therein; however, they may be significant enough to cause an unexpected change in a TTL or an ECL logic value when transmitted to a TTL- or an ECL-based system.

Clearly, unexpected changes in logic values are not desirable. They can cause significant operational errors. Therefore, it is important to provide a transceiver driver that will not generate excessive signal potential swings—other than those specifically desired to achieve a logic level shift. This problem is more likely to occur as transmission rates are increased. Increasing transmission rates enables the transfer of more data in a shorter time period and so is desirable in many respects. However, the gain in increased transmission rate is often undermined by an increase in signal noise. That is, a rapid change in signal level creates an oscillation about the steady state value corresponding to the sudden switching on or off of a transistor. The extent of the oscillation is dependent upon the particular transistor system used as well as the loading on the backplane bus.

As transistors become increasingly smaller in order to achieve the faster transmission rates of interest, the corresponding differential swings associated with their logic outputs are reduced. When the wider-swing CMOS logic systems interface with smaller-swing bipolar-transistor-based logic systems the noise associated with CMOS operation may generate enough of a swing to cause an undesired transistor switching. The signal bounce that occurs with the rapid switching often creates reflections in transmission media, such as telephone transmission lines where reflections will cause signal errors. It is therefore important to enable "gentle" switching of driver transistors so that signal noise is reduced when logic levels are changed.

One means for achieving some success in smoothing signal transitions in a transceiver driver has been described in U.S. Pat. No. 5,557,223 issued to Kuo. As illustrated in FIG. 1, a CMOS-based signal output driver 10 includes means intended to induce gentle switching of signal transmission. The Kuo driver includes first inverter stage 20, formed of first inverter I1 for receiving an incoming signal INPUT that is to be transmitted, and second inverter I2. Those components, along with third inverter stage 13, current mirroring transistors M199 and M197, and output transistor M202 are all relatively standard components of an output driver for delivering output signal OUTPUT. Transistors M197 and M199 are always on, as can be seen from their coupling and the use of temperature-compensation gate drivers TCD1 and TCD2, respectively. The Kuo circuit further includes discharge circuit 30 that is coupled to the gate of transistor M202 for the purpose of slowing the switching of that output transistor so that signal bounce and reverberation may be minimized. Discharge circuit 30 includes first discharge transistor M440, second discharge transistor M441, and inverter I4.

The Kuo circuit 10 is designed to provide a built-in delay in the discharge of transistor M202. An input signal at node INPUT that produces a logic high at the gate of transistor M202 also produces a logic high at the gate of transistor M440. It also produces a logic low at the gate of transistor M441. The result is that transistors M202 and M440 are on, while transistor M441 is off, thereby preventing current to pass through that branch of circuit 30 including M440 and M441. This situation results in a logic low signal at OUTPUT. When the input signal to circuit 10 switches to produce a logic low at the gate of M202 and a logic high at the inputs of inverter I4 and transistor M441, transistor M441 is turned on. Because of the gate delay caused by inverter I4, transistor M440 remains on. This results in a diversion of current from the gate of transistor M202 until I4 acts to switch off transistor M440, enabling complete turn off of M202.

The Kuo output driver of FIG. 1 is useful in softening the switching of output transistor M202. However, there are several deficiencies associated with the discharge circuit 30. Specifically, it is well known that there are vagaries associated with the fabrication of semiconductor devices. For active devices in particular, characteristics can vary by as much as 30% on chip and from chip to chip. Given the various steps and complexity associated with the formation of a transistor, for example, this is not surprising. Unfortunately, fabrication variations yield undesirable performance variations that are of increasing concern as components become smaller and acceptable operating ranges narrow. Given the introduction of transistors M440 and M441, as well as the combination of transistors and other elements likely used to create inverter I4, it is apparent that the Kuo discharge circuitry fails to address this issue. Kuo suggests that I4 may be formed of multiple inverter stages that would increase the problem. Variations in operating conditions, including temperature and supply voltages, will also effect changes in the operating performance of the Kuo transistors.

Unknown variations in operating performance are undesirable from an engineering standpoint. Instead, the designer of a transmission system requires consistency and uniformity that is likely not adequately available through the Kuo circuit. Further, the sensitivity to fabrication and environmental vagaries limit the designer's ability to program accurately the rate of switching of the output transistor. Therefore, what is needed is a transceiver driver that will produce an output signal that is substantially independent of fabrication, temperature, and supply voltage conditions. Further, what is needed is such a transceiver driver that is reliably programmable.

SUMMARY OF THE INVENTION

It is an object of the present invention to provide a transceiver driver circuit that will produce an output signal that is substantially independent of fabrication, temperature, and supply voltage conditions. It is also an object of the present invention to provide such a circuit that is programmable.

These and other objects are achieved in the present invention through the modification of the Kuo circuit to eliminate the discharge circuit shown in FIG. 1 and adding a first discharge element for pull-up conditions and a second discharge element for pull-down conditions. The primary components of the generic output driver disclosed in FIG. 1 remain substantially the same. However, the driver of the present invention includes the noted discharge elements coupled to the inverter stage identified as inverter I3. In particular, the first discharge element is preferably coupled between the high-potential power rail Vcc and the source of transistor M201, while the second discharge element is coupled between the low-potential power rail GND and the source of transistor M198. That is, rather than a direct manipulation of the gate of output transistor M202, the present invention modifies the turning on and off of M202 by regulating the current delivered to its gate. The use of a capacitive element rather than a set of discharge transistors ensures a gradual turning on or off of the output transistors since there is no threshold voltage to be overcome for initial discharge transistor operation. That obligation can also cause some noise, although to a lesser extent.

The first and second discharge elements of the present invention are preferably formed as capacitors. Present fabrication processes permit the formation of well-defined capacitive elements that are substantially less sensitive to process, temperature, and, certainly, supply voltage, variations than are transistor systems of the type disclosed by Kuo. Further, with the availability of increasingly smaller semiconductor devices, it is possible to provide capacitive elements to the fabrication process without taking up too much space on the chip. Present fabrication processes also enable the fabrication of well-defined capacitive elements, which in turn allows the designer to program the operation of the transceiver driver with relatively tighter tolerances. It is to be noted that, with essentially a single capacitive element, variations in fabrication processes on chip and from chip to chip have less substantially effect on operational characteristics than those experienced in the Kuo design.

Therefore, the present invention permits the design of a driver with highly programmable edge rate control, which driver operation is substantially independent of fabrication, supply voltage, and temperature vagaries. These and other advantages of the present invention will become apparent upon review of the following detailed description, the accompanying drawings, and the appended claims.

DESCRIPTION OF THE PREFERRED EMBODIMENT OF THE INVENTION

Figure 1:
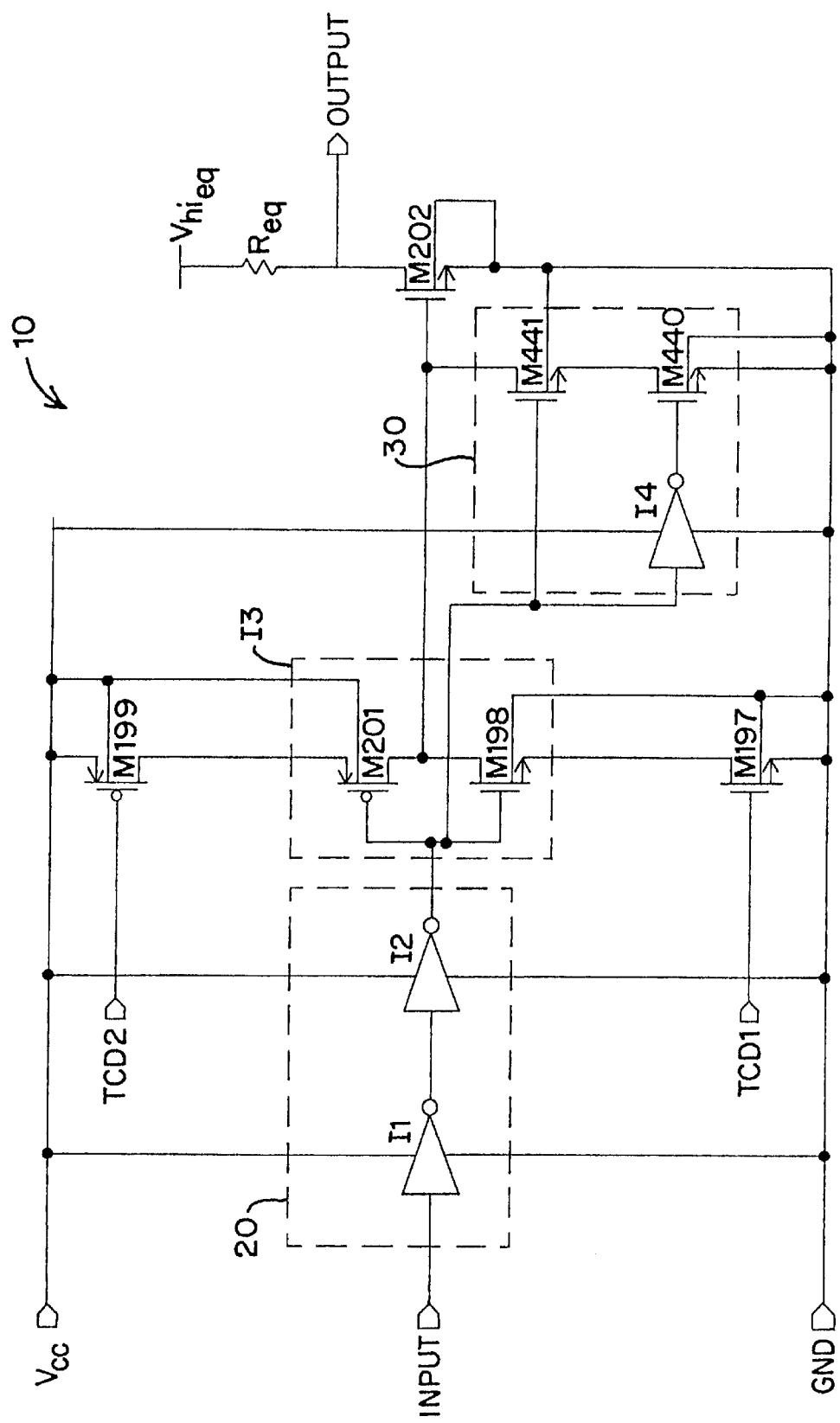
FIG. 1 is a simplified circuit diagram showing the prior-art output driver described by Kuo.
Figure 2:
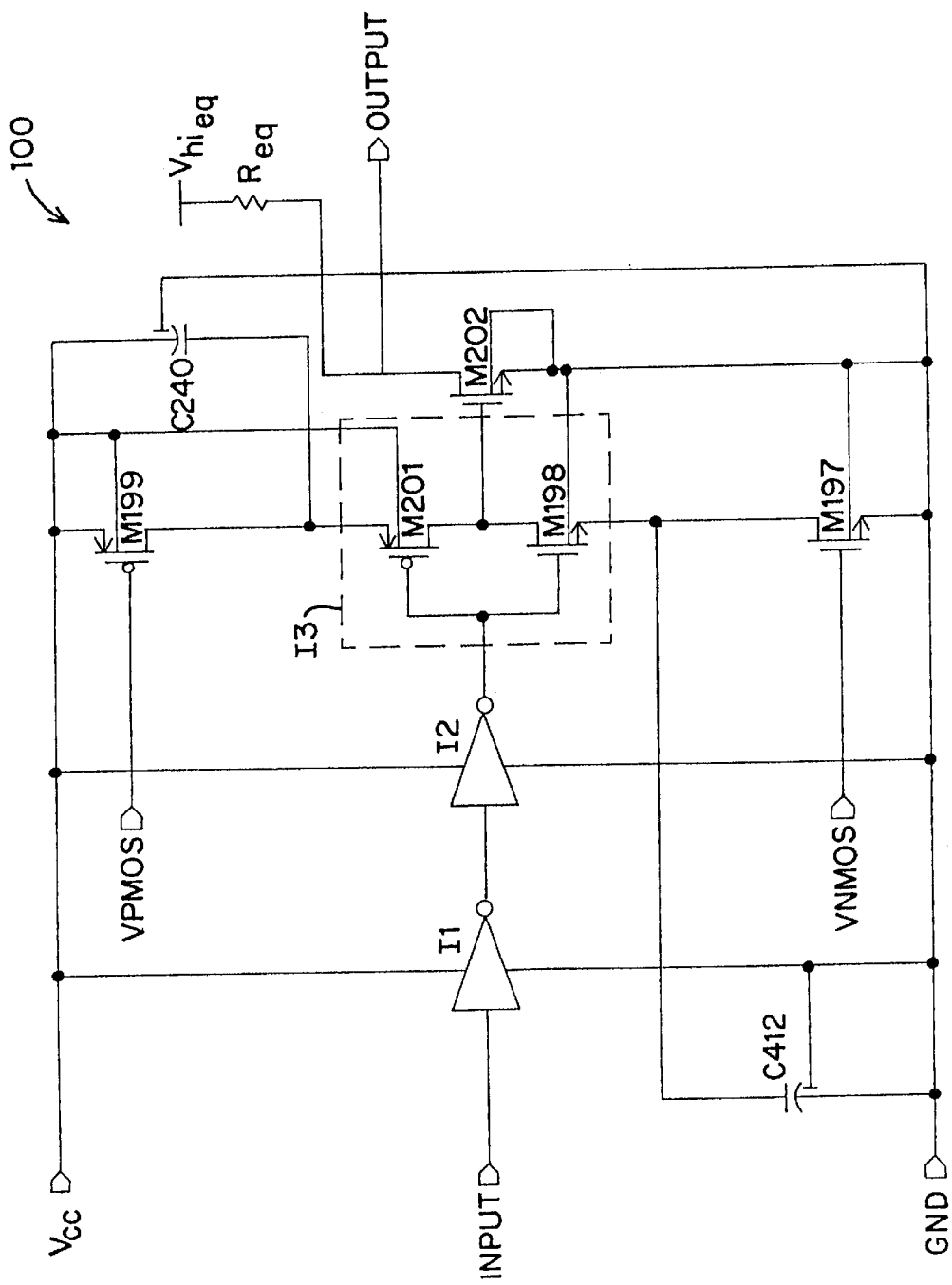
FIG. 2 is a simplified circuit diagram showing the programmable driver of the present invention.

A transceiver logic driver 100 of the present invention is shown in FIG. 2. Those components of the driver 100 that are the same as the components of.the prior-art driver of FIG. 1 are assigned the same component designations. Thus, the inverters I1, I2, and I3 are the same, as are independently-controlled, always-on transistors M197 and M199. Output transistor M202, is also the same; however, its operation is modified by the discharge elements of the present invention. A first pull-down-modifying capacitive element C412 and a second pull-up-modifying capacitive element C240 complete the driver 100 of the present invention, which may be coupled to any circuitry requiring amplification and/or wave shaping for transfer from one location to another. The discharge elements may both be incorporated into the design of the driver 100; however, it is possible to use only one or the other if only shaping of either the pulldown leg or the pull-up leg of the operation of transistor M202 is of interest.

The driver 100 involves the coupling of inverter I1 to an input node INPUT for receiving a logic signal, in the form of an electrical charge, from a signal generating system. Inverter I1 is coupled to inverter I2. Both inverters are coupled to power rails Vcc and GND for operation. An output of inverter I2 is coupled to an input of inverter I3, which includes PMOS transistor M201 having its drain coupled to the drain of NMOS transistor M198. The source of transistor M201 is coupled to the drain of always-on PMOS transistor M199. Transistor M199 is maintained on via the coupling of its gate to an independent signal source, developed in any way well known to those skilled in this field, designated as VPMOS that provides a continuous signal at a potential sufficiently less than the potential of Vcc, which is coupled to the source of M199. The source of transistor M198 is coupled to the drain of always-on transistor M197. Transistor M197 is maintained on via the coupling of its gate to a second independent signal source, preferably developed in the same manner provided for in generating VPMOS, designated as VNMOS that provides a continuous signal at a potential sufficiently greater than the potential of GND, which is coupled to the source of M197. It is to be noted that VPMOS and VNMOS may be generated by a single reference fanned out using current mirroring to provide multiple signal sources.

The output of inverter I3 is coupled to the gate of output transistor M202, which has its source coupled to GND and its drain coupled to the output node OUTPUT. OUTPUT is also tied to a high-potential node identified by Vhieq through resistance Req in order to provide the potential sufficient for the delivery of a logic high signal at OUTPUT, which is the point at which the driver 100 is coupled to circuitry designed to receive the driver's signal. That signal delivered at OUTPUT is dependent upon the operation of capacitive elements C412 and C240. Those two elements are preferably capacitors of selectable size, capacitance, and dimension. The capacitive elements may include one or more capacitors in parallel, which additionally may be coupled to means for trimming, such as a fuse. In that way, a generic fabrication process may be used to fabricate the driver, with the designer later enabled to tune the capacitance of either the first or the second capacitive element by way of the trimming means.

While the capacitive element C240 is shown having its low-potential node coupled to the high-potential node of transistor M201, there is an alternative coupling arrangement contemplated. Specifically, the low-potential node of C240 may be coupled to a high-potential node of a start-up transistor, with the low-potential node of that start-up transistor coupled to the control node of M202. The control node of that start-up transistor would be coupled to one or more inverters. This configuration enables separate turn-on of capacitive element C240, but with the potential side effect of some additional noise under certain extreme conditions. A similar arrangement may be developed for turning on capacitive element C412.

In operation, the driver 100 acts as follows. In a steady state situation in which the gate of output transistor M202 is initially at a logic level low, transistor M201 is off. In addition, transistor M198 is on and capacitive element C240 is charged up to the potential of rail Vcc by way of always-on transistor M199. When the signal at input node INPUT switches from a logic high to a logic low, the potential at the gate of M201 goes low, turning that transistor on. This causes the capacitive element C240 to charge the gate of M202, but not all the way above the threshold potential required to turn that transistor completely on. The current now available to the gate of M202 by way of transistor M199 is then sufficient to pull the potential at the gate of M202 all the way up to Vcc. Thus, the voltage swing at the gate of transistor M202 used to turn that transistor on can be very precisely programmed through the design and selection of the capacitance of C240 and the current through M199. This is the programming available for the tailoring of the transition of an output signal changing from logic high to logic low.

In a similar manner, the smoothing and tailoring of the transition of OUTPUT from a logic low to a logic high can be achieved, this time by way of capacitive element C412. That is, when the gate of M202 is at a steady state potential equivalent to a logic high signal, M201 is on, M198 is off, and capacitive element C412 is discharged to the potential of rail GND by way of always-on transistor M197. When the input signal at INPUT switches from a logic low to a logic high, the potential at the gate of M202 switches from high to low by way of the turning on of transistor M198. This in turn causes a charging up of element C412 lowering the potential on the gate of transistor M202 as a result of the current draw through the branch including element C412. The current through transistor M197 then moves through transistor M198 so as to pull the potential at the gate of transistor M202 substantially all the way down to the potential of rail GND. Thus, the voltage swing at the gate of transistor M202 used to turn that transistor off can be very precisely programmed through the design and selection of the capacitance of C412 and the current through M197. This is the programming available for the smoothing and tailoring of the transition of a driver output signal changing from logic low to logic high.

Figure 3:
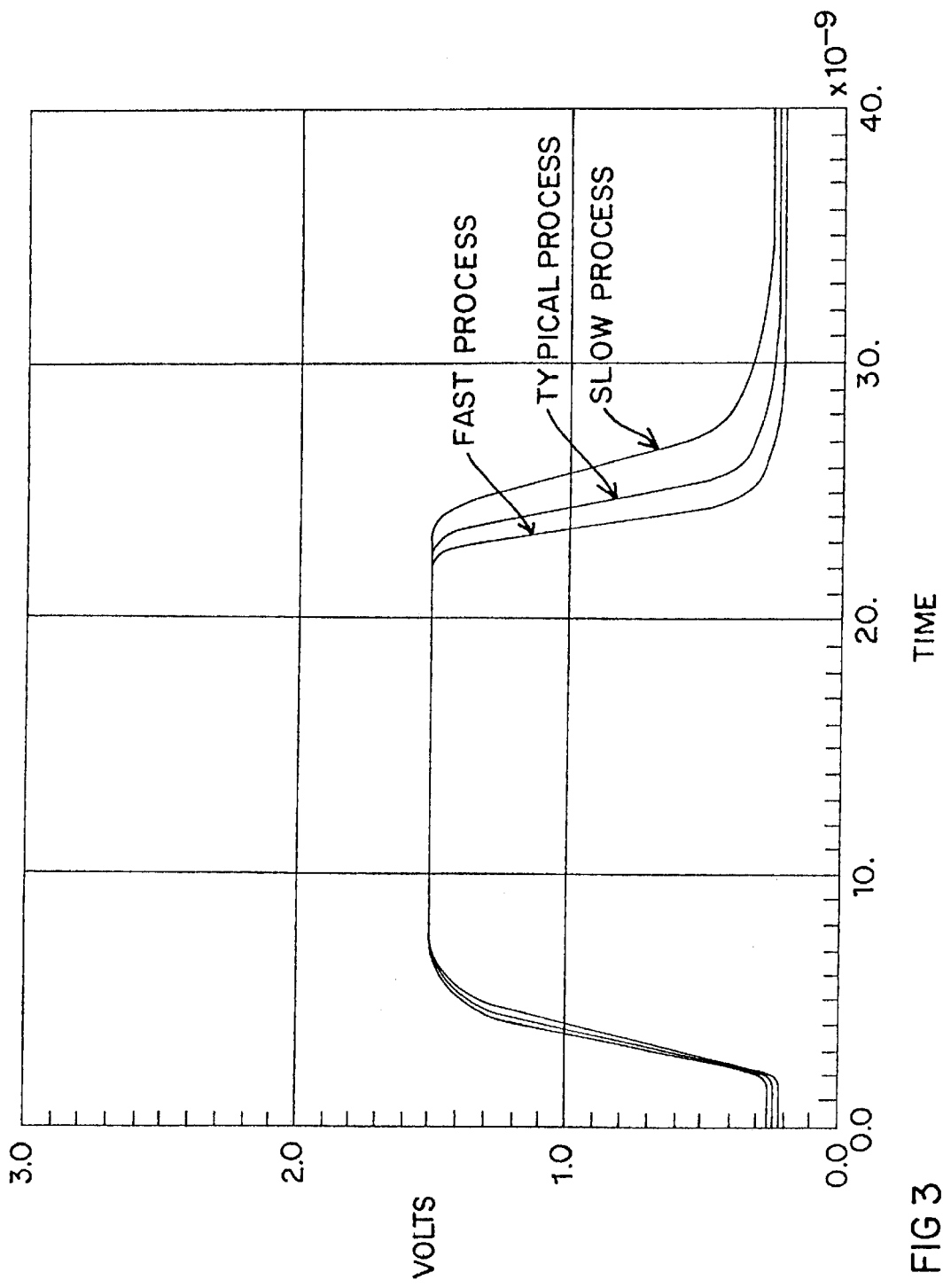
FIG. 3 is a waveform diagram showing the effect of varying process conditions on the operation of the prior-art Kuo driver.
Figure 4:
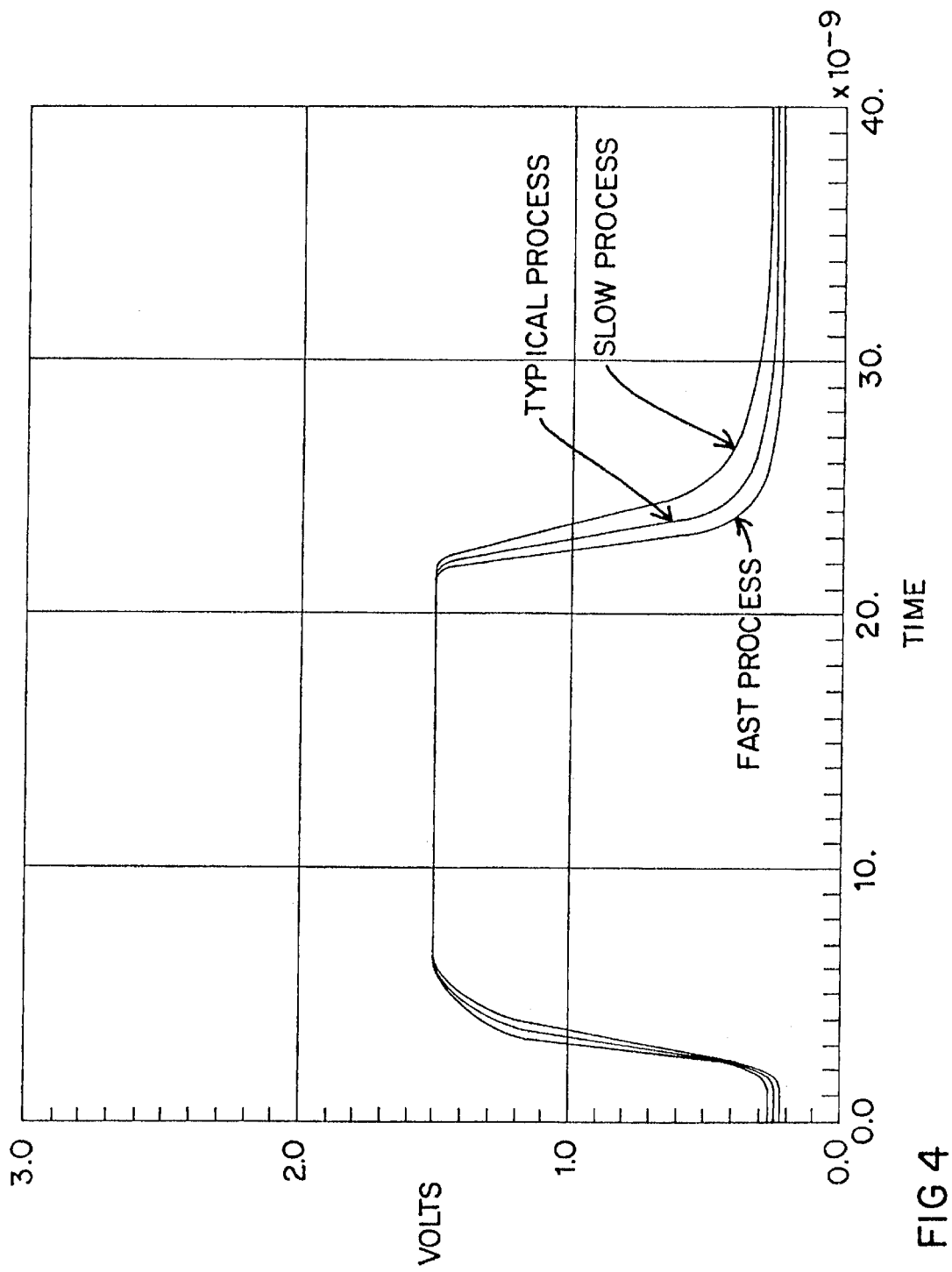
FIG. 4 is a waveform diagram showing the effect of varying process conditions on the operation of the driver of the present invention.

FIG. 3 provides a simplified illustration of the rate of change of the signal at the node OUTPUT from a high to a low for the Kuo driver 10. It can be seen that the difference between a "fast" fabrication process and a "slow" fabrication process yields a signal output differential of five nanoseconds or more. In this case, a "fast" fabrication process involves any sort of increases in implanting concentrations, depths, etc., that provide for lower channel resistances, higher β values, and the like. Correspondingly, a "slow" fabrication process relates to lighter implant concentrations, shallower drives, etc., resulting in higher resistances, lower β values, etc. The equivalent variations in fabrication rates for the driver 100 of the present invention, the capacitive elements of the present invention substantially reduce the associated variation to as little as about two nanoseconds, a substantial reduction under the operating conditions of present semiconductor arrangements. It is to be noted that the variations in output rates for changes in signal conditions are even less for the driver 100 when supply voltage and operating temperatures are changed.

While the invention has been described with reference to particular example embodiments, it is intended to cover all modifications and equivalents within the scope of the following claims.

I claim:

1. A transceiver driver having an input node and an output node, the driver comprising:
   a. an inverter including a first inverter transistor and a second inverter transistor, wherein a control node of said first inverter transistor and a control node of said second inverter transistor are coupled to the input node;
   b. a first always-on transistor coupled between a high-potential power rail and a high-potential node of said first inverter transistor and having a control node coupled to a first independent reference potential source;
   c. a second always-on transistor coupled between a low-potential power rail and a low-potential node of said second inverter transistor and having a control node coupled to a second independent reference potential source;
   d. a first capacitive element coupled between said high-potential power rail and said high-potential node of said first inverter transistor;
   e. a second capacitive element coupled between said low-potential power rail and said low-potential node of said second inverter transistor; and
   f. an output transistor having a control node coupled to a low-potential node of said first inverter transistor and to a high-potential node of said second inverter transistor, and a high-potential node coupled to the output node, wherein said first capacitive element and said second capacitive element are coupled through said inverter to said control node of said output transistor so as to regulate current delivery thereto.

2. The driver as claimed in claim 1 wherein said first capacitive element is a single capacitor.

3. The driver as claimed in claim 2 wherein said second capacitive element is a single capacitor.

4. The driver as claimed in claim 1 wherein said first capacitive element includes a plurality of capacitors coupled together in parallel.

5. The driver as claimed in claim 4 wherein said second capacitive element includes a plurality of capacitors coupled together in parallel.

6. The driver as claimed in claim 1 further comprising a pair of inverters in series coupled between the input node and said inverter.

7. The driver as claimed in claim 6 wherein said first inverter transistor and said first always-on transistor are PMOS transistors, and wherein said second inverter transistor, said second always-on transistor, and said output transistor are NMOS transistors.

8. A transceiver driver having an input node and an output node, the driver comprising:
   a. an inverter including a first inverter transistor and a second inverter transistor, wherein a control node of said first inverter transistor and a control node of said second inverter transistor are coupled to the input node;
   b. a first always-on transistor coupled between a high-potential power rail and a high-potential node of said first inverter transistor and having a control node coupled to a first independent reference potential source;
   c. a second always-on transistor coupled between a low-potential power rail and a low-potential node of said second inverter transistor and having a control node coupled to a second independent reference potential source;
   d. a capacitive element coupled between said high-potential power rail and said high-potential node of said first inverter transistor; and
   e. an output transistor having a control node coupled to a low-potential node of said first inverter transistor and to a high-potential node of said second inverter transistor, and a high-potential node coupled to the output node, wherein said capacitive element is coupled through said inverter to said control node of said output transistor so as to regulate current delivery thereto.

9. The driver as claimed in claim 8 wherein said capacitive element is a single capacitor.

10. The driver as claimed in claim 8 wherein said capacitive element includes a plurality of capacitors coupled together in parallel.

11. The driver as claimed in claim 8 further comprising a pair of inverters in series coupled between the input node and said inverter.

12. The driver as claimed in claim 11 wherein said first inverter transistor and said first always-on transistor are PMOS transistors, and wherein said second inverter transistor, said second always-on transistor, and said output transistor are NMOS transistors.

13. A transceiver driver having an input node and an output node, the driver comprising:
   a. an inverter including a first inverter transistor and a second inverter transistor, wherein a control node of said first inverter transistor and a control node of said second inverter transistor are coupled to the input node;
   b. a first always-on transistor coupled between a high-potential power rail and a high-potential node of said first inverter transistor and having a control node coupled to a first independent reference potential source;
   c. a second always-on transistor coupled between a low-potential power rail and a low-potential node of said second inverter transistor and having a control node coupled to a second independent reference potential source;
   d. a capacitive element coupled between said low-potential power rail and said low-potential node of said second inverter transistor; and
   e. an output transistor having a control node coupled to a low-potential node of said first inverter transistor and to a high-potential node of said second inverter transistor, and a high-potential node coupled to the output node, wherein said capacitive element is coupled through said inverter to said control node of said output transistor so as to regulate the delivery of current thereto.

14. The driver as claimed in claim 13 wherein said capacitive element is a single capacitor.

15. The driver as claimed in claim 13 wherein said capacitive element includes a plurality of capacitors coupled together in parallel.

16. The driver as claimed in claim 13 further comprising a pair of inverters in series coupled between the input node and said inverter.

17. The driver as claimed in claim 16 wherein said first inverter transistor and said first always-on transistor are PMOS transistors, and wherein said second inverter transistor, said second always-on transistor, and said output transistor are NMOS transistors.

* * * * *